(12) United States Patent
Alappat et al.

(10) Patent No.: US 9,564,117 B2
(45) Date of Patent: *Feb. 7, 2017

(54) LIMITING PEAK AUDIO POWER IN MOBILE DEVICES

(71) Applicant: Intel Corporation, Santa Clara, CA (US)

(72) Inventors: Kuriappan P. Alappat, Portland, OR (US); Vijayakumaran V. Nair, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 233 days.

This patent is subject to a terminal disclaimer.

(21) Appl. No.: 14/071,966

(22) Filed: Nov. 5, 2013

(65) Prior Publication Data

US 2014/0098973 A1    Apr. 10, 2014

Related U.S. Application Data

(63) Continuation of application No. 12/827,317, filed on Jun. 30, 2010, now Pat. No. 8,577,056.

(51) Int. Cl.
*H04B 15/00* (2006.01)
*G10K 11/16* (2006.01)
*H03G 5/16* (2006.01)

(52) U.S. Cl.
CPC .............. *G10K 11/16* (2013.01); *H03G 5/165* (2013.01)

(58) Field of Classification Search
CPC ........ H03G 5/165; H03G 3/348; H03G 9/025; H03G 3/32; H03G 5/025

USPC ...................... 381/94.1, 94.2, 94.3, 94.5, 103
See application file for complete search history.

(56) References Cited

U.S. PATENT DOCUMENTS

| | | | |
|---|---|---|---|
| 3,569,633 A * | 3/1971 | Brahman | H04B 1/1661 381/11 |
| 6,127,809 A | 10/2000 | Kates et al. | |
| 6,184,660 B1 | 2/2001 | Hatular | |
| 6,421,448 B1 * | 7/2002 | Arndt et al. | 381/312 |
| 6,795,559 B1 | 9/2004 | Taura et al. | |
| 7,146,015 B2 | 12/2006 | Ramsden | |
| 7,356,326 B2 | 4/2008 | Kim | |
| 7,551,743 B1 | 6/2009 | Tsujishita et al. | |
| 8,577,056 B2 * | 11/2013 | Alappat et al. | 381/94.1 |
| 2003/0188210 A1 | 10/2003 | Nakazato | |
| 2005/0040787 A1 | 2/2005 | Choi | |
| 2006/0259300 A1 | 11/2006 | Winsvold | |

(Continued)

FOREIGN PATENT DOCUMENTS

WO    2009/004284 A1    1/2009

OTHER PUBLICATIONS

Mullen et al., "Power Management Control System and Method", U.S. Appl. No. 12/646,139, filed on Dec. 23, 2009, 50 pages.

(Continued)

*Primary Examiner* — Alexander Jamal
(74) *Attorney, Agent, or Firm* — Jordan IP Law, LLC

(57) ABSTRACT

Systems and methods of limiting peak audio power in mobile devices may include a high pass filter and a burst module to detect a burst load condition in a mobile device. The burst module can also apply the high pass filter to an audio signal of the mobile device in response to the burst load condition to obtain a filtered signal, and transmit the filtered audio signal to a speaker of the mobile device.

17 Claims, 4 Drawing Sheets

(56) References Cited

U.S. PATENT DOCUMENTS

| | | |
|---|---|---|
| 2008/0013647 A1 | 1/2008 | Suzuki |
| 2008/0150488 A1 | 6/2008 | Lu et al. |
| 2009/0271186 A1* | 10/2009 | LeBlanc et al. ............ 704/226 |
| 2009/0295334 A1 | 12/2009 | yang et al. |
| 2011/0148383 A1* | 6/2011 | Mullen ................ G06F 1/3203 323/299 |
| 2011/0200203 A1* | 8/2011 | Chu ............................... 381/74 |

OTHER PUBLICATIONS

Non-Final Office Action for U.S. Appl. No. 12/827,317, mailed Oct. 23, 2012, 10 pages, United States Patent and Trademark Office.
Notice of Allowance for U.S. Appl. No. 12/827,317, mailed Mar. 1, 2013, 12 pages, United States Patent and Trademark Office.
Notice of Allowance for U.S. Appl. No. 12/827,317, mailed Jun. 27, 2013, 16 pages, United States Patent and Trademark Office.

\* cited by examiner

LIMITING PEAK AUDIO POWER IN MOBILE DEVICES

CROSS-REFERENCE TO RELATED APPLICATIONS

This application is a continuation of U.S. patent application Ser. No. 12/827,317, filed Jun. 30, 2010, now U.S. Pat. No. 8,577,056 which is related to U.S. patent application Ser. No. 12/646,139, filed Dec. 23, 2009.

BACKGROUND

Technical Field

Embodiments generally relate to limiting peak audio power in mobile devices. More particularly, embodiments relate to selectively applying a high pass filter to audio signals in response to detection of burst load conditions.

Discussion

Mobile device batteries can experience GSM (Global System for Mobile Communications) and camera flash burst loads, as well as burst loads from other system components such as CPUs (central processing units), IHF (integrated hands free) speakers and haptic feedback components. These burst loads may occur concurrently, which could have a negative impact on power consumption and battery life.

BRIEF DESCRIPTION OF THE DRAWINGS

The various advantages of the embodiments of the present invention will become apparent to one skilled in the art by reading the following specification and appended claims, and by referencing the following drawings, in which:

DETAILED DESCRIPTION

Embodiments may provide for an apparatus including a high pass filter and a burst module to detect a burst load condition in a mobile device. The burst module can also apply the high pass filter to an audio signal of the mobile device in response to the burst load condition to obtain a filtered audio signal, and transmit the filtered audio signal to a speaker of the mobile device.

Embodiments can also include a system having an integrated hands free speaker module, an audio source to generate an audio signal, a high pass filter, and a burst module to detect a burst load condition in the system. The burst module may also apply the high pass filter to the audio signal in response to the audio signal in response to the burst load condition to obtain a filtered audio signal, and transmit the filtered audio signal to the integrated hands free speaker module.

Other embodiments may include a computer readable storage medium having a set of stored instructions which, if executed by a processor, cause a mobile device to detect a burst load condition in the mobile device and apply a high pass filter to an audio signal of the mobile device in response to the burst load condition. Applying the high pass filter can produce a filtered audio signal, which may be transmitted to a speaker of the mobile device.

Generally, batteries can have both steady state and peak discharge rate specifications and violation of either could cause unplanned device shutdown and/or damage to the battery. The higher the peak battery discharge rate, the lower the allowed discharge duration for specification compliance. For example, a typical single cell Li-ion battery could have a steady state discharge specification of 3 A and a peak discharge specification of 4 A for 5 mS and 5 A for 3 mS durations. Techniques described herein provide for shaping low frequency (or longer duration) audio burst loads to meet a battery's peak power envelope specification with minimum impact to user experience.

Figure 1A:
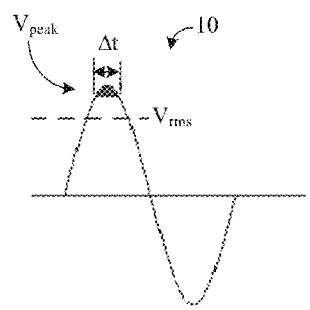
FIGS. 1A and 1B are plots of examples of peak audio power curves according to embodiments.
Figure 1B:
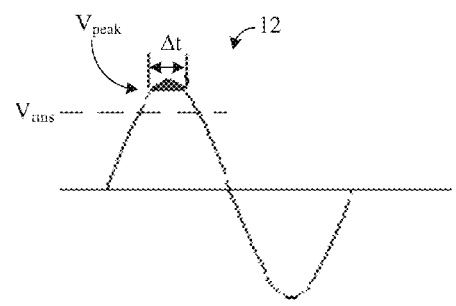

FIGS. 1A and 1B show a high frequency audio signal curve 10 and a relatively low frequency audio signal curve 12, respectively. The curves 10, 12 might correspond to content in audio signals to be output from a mobile device, wherein the content could be obtained from a music source, HD (high definition) video source, etc., and directed to a speaker of the mobile device such as an integrated hands free (IHF) speaker module. The curves 10, 12 generally demonstrate that the amplitude and width of the peak audio power can be a function of the frequency of the audio signal and the phase of its components. The illustrated high frequency audio signal curve 10, for example, has a peak voltage duration ($\Delta t$) that is substantially shorter than the peak voltage duration of the low frequency audio signal curve 12 for a similar root mean squared voltage ($V_{rms}$). Thus, the lower frequency audio signal curve 12 results in a wider burst load to be handled by the battery.

As will be discussed in greater detail below, filtering low frequency content from audio signals may result in narrower audio burst loads. Moreover, by selecting the appropriate filtering cutoff frequency, audio burst loads can be tailored to meet a given peak power budget. Indeed, because mobile devices typically have relatively small speakers and their form factors can have small back cavities (especially for cell phones and smart phones), the low frequency response of the mobile device may be limited and removal of low frequency audio could be transparent to the user.

Figure 2:
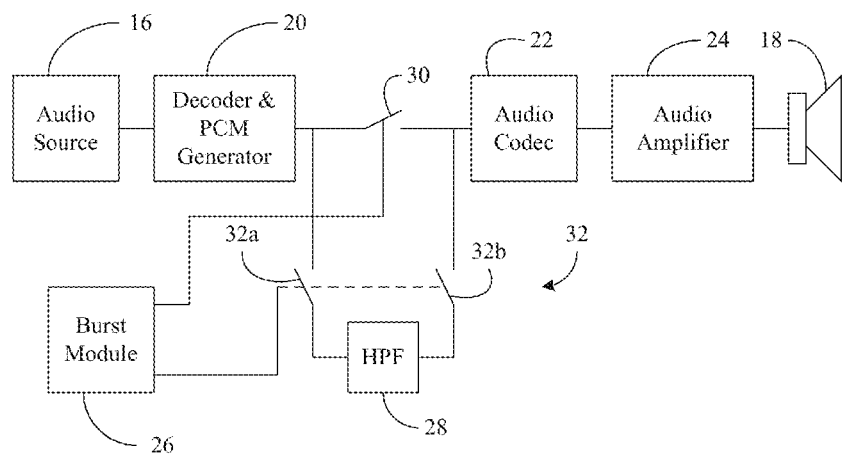
FIG. 2 is a block diagram of an example of a burst module and high pass filter (HPF) according to an embodiment.

Turning now to FIG. 2, an audio processing pipeline 14 is shown in which an audio source 16 generates an audio signal destined for a speaker module 18. In particular, the illustrated audio source 16 could include a music source or high definition (HD) content source, wherein the audio signal might draw burst loads from a battery. For example, the user of a mobile device containing the processing pipeline 14 might view an HD action movie that sends high audio output power to the speaker module 18 of the mobile device. The processing pipeline 14 may also include a decoder and PCM (pulse code modulation) generator 20 to decode, sample and quantize the audio signal for processing by an audio codec 22. The output from the audio codec 22 can be sent to an audio amplifier (e.g., class D amplifier) 24 and then to the speaker module 18 for audible output (e.g., left and right audio paths).

Generally, the illustrated processing pipeline 14 selectively filters out low frequency content to dynamically manage burst loads associated with the high audio output power. Indeed, the mobile device could also contain other components (e.g., tactile notification/feedback, video, display, CPU, etc., not shown) that generate burst loads concurrently with the burst loads associated with the high output power audio signal from the audio source 16. The combined and/or individual burst loads might have a negative impact with regard to the peak power envelope specification of the mobile device battery. Accordingly, the illustrated processing pipeline 14 includes a burst module 26 to detect one or more burst load conditions in the mobile device and apply a high pass filter (HPF) 28 to the audio signal in response to detecting the burst load condition. In one example, the burst module 26 opens logical switch 30 and closes logical switches 32 (32a-32b) if a burst load condition is present, and closes logical switch 30 and opens logical switches 32 if a burst load condition is not present.

Burst load conditions may include, but are not limited to, cellular (e.g., GSM), graphics engine, CPU and global positioning system (GPS) burst conditions, tactile notification and/or feedback (e.g., "vibra") events, camera flash events, and over current conditions in a power supply (e.g., battery) of the mobile device. The illustrated HPF 28 removes content from the audio signal that is below a certain cutoff frequency (e.g., 450 Hz), wherein the filtering process can cause the filtered audio signal to have a power level that is below a particular threshold with minimal or no impact on the user's listening experience depending on the audio content and the listener's ear sensitivity. Moreover, real time control of the HPF 28 can be advantageous because filtering may occur only during short durations. For example, a GSM burst associated with a modem parked on a 2G (second generation) network might involve a high pass filtering duration on the order of 577 μS, and a vibra start could cause the burst module 26 to apply the HPF 28 for several milliseconds. The burst module 26 may also provide for transmission of the filtered audio signal to the speaker module 18 via the audio codec 22 and audio amplifier 24. The components of the processing pipeline 14 could be implemented in hardware, or programmable software/firmware. In the case of a hardware analog implementation, the HPF 28 may be switched into the pipeline just before the audio amplifier 24.

Figure 3A:
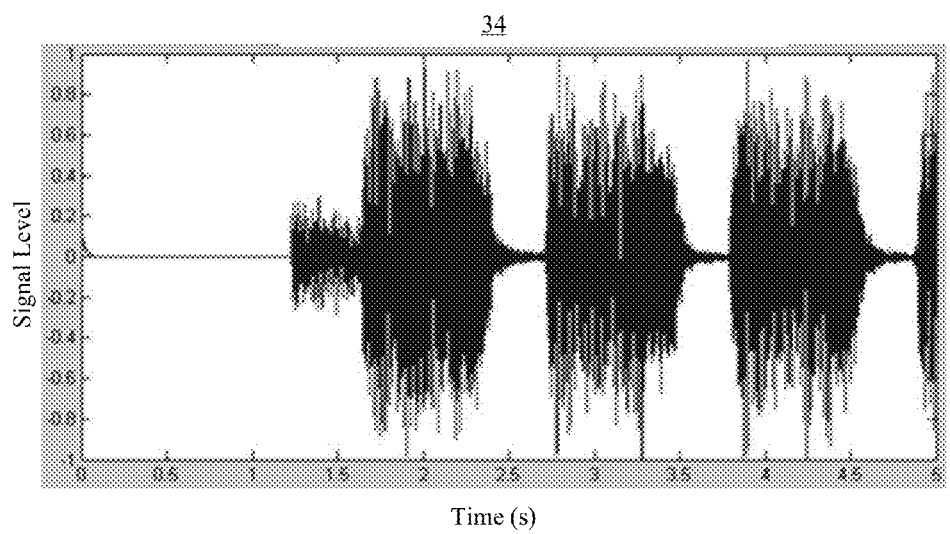
FIGS. 3A and 3B are plots of examples of an input audio signal and a filtered audio signal, respectively, according to an embodiment.
Figure 3B:
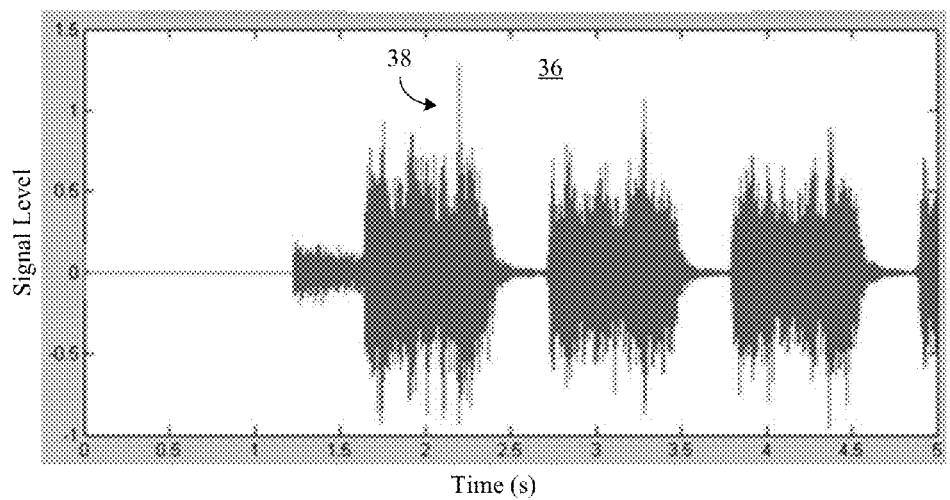

FIG. 3A shows an input waveform 34 for an input audio signal containing rock music, and FIG. 3B shows a filtered waveform 36 after real time application of an HPF with a corner frequency of 201 Hz. The signal level of the illustrated filtered waveform 36 is reduced due to the removal of the lower frequency (longer duration) content. Although the HPF could induce spikes such as the spike in region 38, the duration of the spikes may be short and can have minimal impact on power.

Figure 4A:
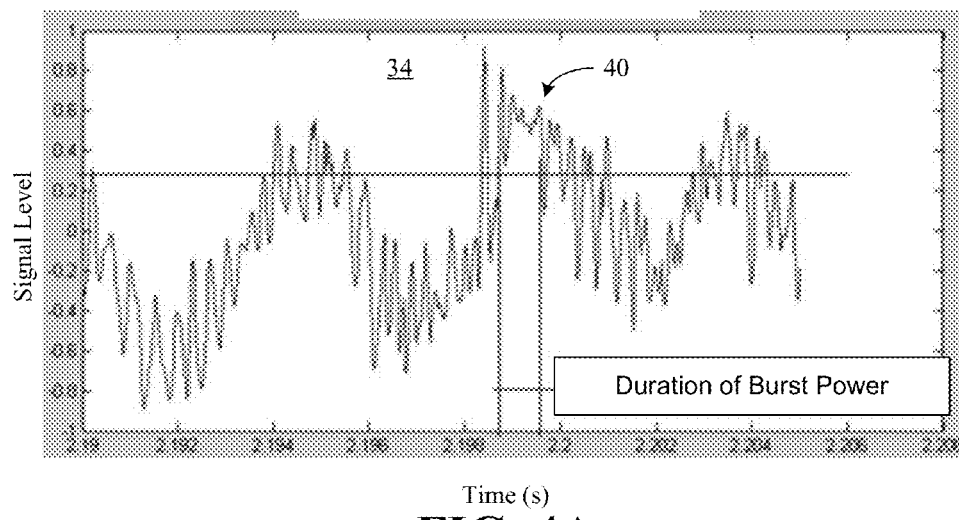
FIGS. 4A and 4B are plots of examples of zoomed in views of the plots in FIGS. 3A and 3B, respectively, according to an embodiment.
Figure 4B:
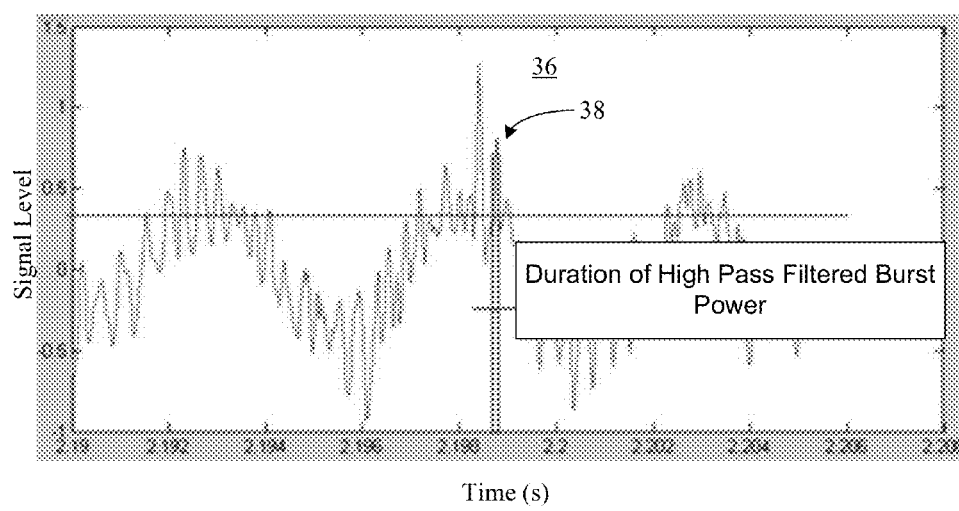

For example, FIGS. 4A and 4B show that the region 38 of the filtered waveform 36 has energy with a much shorter duration than energy in a corresponding region 40 of the input waveform 34 at the same power level.

Figure 5:
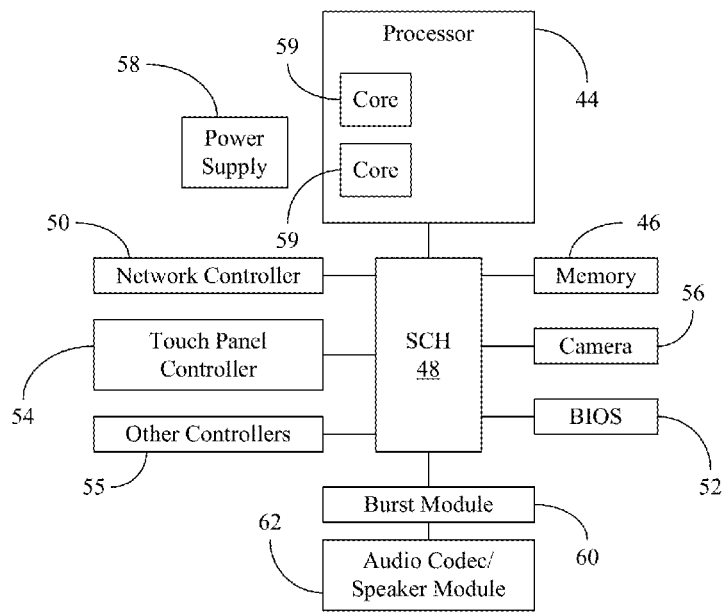
FIG. 5 is a block diagram of an example of a system according to an embodiment.

Turning now to FIG. 5, a system 42 having a processor 44, system memory 46, a system controller hub (SCH) 48, a network controller 50, BIOS (basic input/output system) memory 52 that might be implemented as a plurality of NAND memory devices or other NVM (non-volatile memory), a touch panel controller 54, a camera 56, a power supply 58 (e.g., Li-ion battery, fuel cell, solar panel, power supply rails, AC/DC adaptors, etc.), and various other controllers 55. The system 42 could be part of a mobile platform such as a laptop, mobile Internet device (MID), personal digital assistant (PDA), wireless smart phone, media player, imaging device, etc., or any combination thereof. The system memory 46 could include dynamic random access memory (DRAM) modules. In addition, the processor 44 may include one or more processor cores 59, where each core 59 may be fully functional with instruction fetch units, instruction decoders, level one (L1) cache, execution units, and so on, and can execute an operating system (OS) and various other software applications. The applications executed by the processor 44 could cause burst load conditions that may have a negative impact on the power supply 58.

The illustrated SCH 48 functions as a host device and communicates with the network controller 50, which could provide off-platform communication functionality for a wide variety of purposes such as cellular telephone (e.g., GSM, W-CDMA (UMTS), CDMA2000 (IS-856/IS-2000), etc.), WiFi (e.g., IEEE 802.11, 1999 Edition, LAN/MAN Wireless LANS), Bluetooth (e.g., IEEE 802.15.1-2005, Wireless Personal Area Networks), WiMax (e.g., IEEE 802.16-2004, LAN/MAN Broadband Wireless LANS), Global Positioning System (GPS), spread spectrum (e.g., 900 MHz), and other radio frequency (RF) telephony purposes. The modes of operation of the network controller 50 may therefore lead to burst load conditions.

In addition, the SCH 48 may communicate with the camera 56 and touch panel controller 54, wherein each of these components may be the source of burst load conditions. For example, the camera 56 could be associated with one or more camera flash events during image capture, and the touch panel controller 54 could issue one or more tactile feedback (e.g., vibra) events in response to the user manipulating the touch screen and/or message arrival via the network controller 50. These events could be forwarded or otherwise transmitted to a burst module 60 using bus or other interconnect protocols (e.g., point-to-point interconnect fabric). In addition, the burst module 60 may detect burst load conditions directly from the power supply 58 by using a battery power and/or current monitoring system to sense one or more over current conditions.

The illustrated system 42 therefore uses the burst module 60 to detect one or more bust load conditions in the system 42, and to apply a high pass filter to an audio signal of the system 42 in response to the burst load condition. The filtered audio signal may then be transmitted to an audio output unit 62 including an audio codec and a speaker such as an IHF speaker. The burst module 26 and HPF 28 (FIG. 2), already discussed, could be readily substituted for the illustrated burst module 60 to limit peak audio power in the system 42. The burst module 60 could be incorporated into the audio output unit 62, SCH 48, or other component of the system 42. Indeed, some or all of the components of the system 42 may be implemented as an integrated system on chip (SoC).

Figure 6:
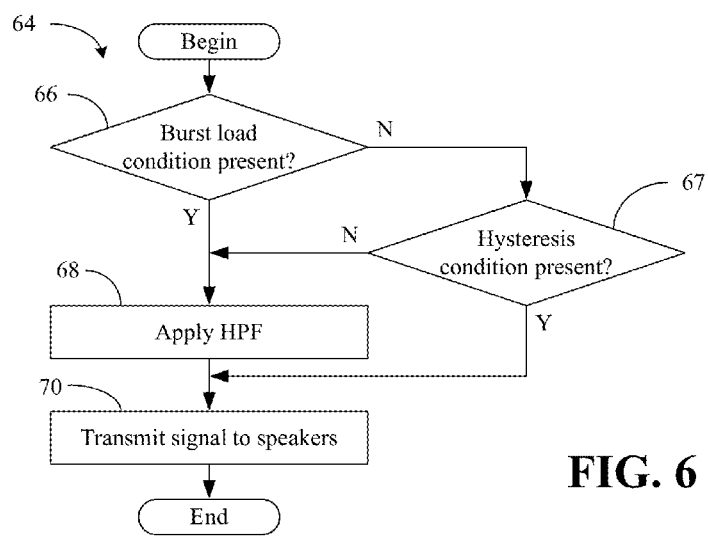
FIG. 6 is a flowchart of an example of a method of limiting audio peak power in a mobile device according to an embodiment.

FIG. 6 shows a method 64 of limiting peak audio power in a mobile device. The method 64 may be implemented in fixed-functionality hardware using circuit technology such as application specific integrated circuit (ASIC), complementary metal oxide semiconductor (CMOS) or transistor-transistor logic (TTL) technology, in executable software as a set of logic instructions stored in a machine- or computer-readable storage medium such as RAM, read only memory (ROM), programmable ROM (PROM), firmware, flash memory, etc., or any combination thereof. Illustrated processing block 66 provides for determining whether a burst load condition is present in the mobile device. The detection of the burst load condition might be based on a burst amplitude threshold (e.g., burst current exceeds a preset/programmable amplitude) and/or a burst duration threshold (e.g., burst condition present for a preset/programmable duration). If the burst condition is present, a high pass filter can be applied to an audio signal of the mobile device at block 68, wherein the high pass filter removes content from the audio signal that is below a cutoff frequency and the filtered audio signal has a power level that is below a power threshold. Block 70 provides for transmitting the filtered audio signal to a speaker of the mobile device.

If it is determined at block 66 that the burst load condition has terminated, a determination may be made at block 67 as to whether a hysteresis condition is present. In particular, to avoid an unpleasant listening experience due to HPF switching oscillations, a hysteresis condition may be used. For example, the burst module might use a lower threshold or wait for a certain duration after the burst current falls below the original threshold in order to remove (e.g., stop applying) the HPF. If the hysteresis condition is not present, the HPF can still be applied to the audio signal at block 68. Otherwise, the audio signal may be transmitted to the speakers without application of the HPF.

Thus, by modifying only a portion of the audible frequency spectrum, wherein the modified portion is in a range that may be imperceptible to the user (due to cavity and speaker size), the approaches described herein can provide a highly tailored approach to limiting peak audio power in mobile devices. In addition, the approaches may free up additional battery load capacity for use by processors and other system components. Moreover, more concurrent applications (e.g., multiple applications using multiple radios) may be possible on a given mobile platform.

Embodiments described herein are applicable for use with all types of semiconductor integrated circuit ("IC") chips. Examples of these IC chips include but are not limited to processors, controllers, chipset components, programmable logic arrays (PLA), memory chips, network chips, and the like. In addition, in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. are used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

We claim:

1. A system comprising:
   an integrated hands free speaker module;
   an audio source to generate an audio signal;
   a high pass filter;
   an audio codec; and
   a burst module to,
      detect a burst load condition in the system, wherein the burst load condition is to present a negative impact with regard to a peak power specification of a mobile device battery,
      apply the high pass filter to the audio signal in response to the burst load condition to obtain a filtered audio signal, wherein the high pass filter is to selectively filter out low frequency content to dynamically manage burst loads associated with a high audio output power,
      transmit the filtered audio signal to the integrated hands free speaker module via the audio codec,
      detect a termination of the burst load condition,
      detect a hysteresis condition, and
      remove the high pass filter from the audio signal in response to the hysteresis condition and the termination of the burst load condition.

2. The system of claim 1, wherein the high pass filter is to remove content from the audio signal that is to be below a cutoff frequency and the filtered audio signal is to have a power level that is to be below a power threshold.

3. The system of claim 1, wherein the audio source is to include at least one of a high definition (HD) content source and a music source, the burst load condition is to include at least one of a cellular burst condition, a tactile feedback event, a camera flash event, a processor burst condition, a graphics burst condition, a global positioning system (GPS) burst condition, and an over current condition in a power supply of the system, and the system has a mobile device form factor.

4. The system of claim 1, wherein the burst module is to detect the burst load condition based on at least one of a burst amplitude threshold and a burst duration threshold.

5. The system of claim 1, wherein the high pass filter is at least one of a hardware filter and a programmable filter.

6. An apparatus comprising:
   a high pass filter;
   an audio codec; and
   a burst module to, detect a burst load condition in a mobile device, wherein the burst load condition is to present a negative impact with regard to a peak power envelope specification of a mobile device battery, apply the high pass filter to an audio signal of the mobile device in response to the burst load condition to obtain a filtered audio signal, wherein the high pass filter is to selectively filter out low frequency content to dynamically manage burst loads associated with a high audio output power, transmit the filtered audio signal to a speaker of the mobile device via the audio codec, detect a termination of the burst load condition, detect a hysteresis condition, and remove the high pass filter from the audio signal in response to the hysteresis condition and the termination of the burst load condition.

7. The apparatus of claim 6, wherein the high pass filter is to remove content from the audio signal that is to be below a cutoff frequency and the filtered audio signal is to have a power level that is to be below a power threshold.

8. The apparatus of claim 6, wherein the burst module is to further receive the audio signal from at least one of a high definition (HD) content source and a music source.

9. The apparatus of claim 6, wherein the burst load condition is to include at least one of a cellular burst condition, a tactile feedback event, a camera flash event, a processor burst condition, a graphics burst condition, a global positioning system (GPS) burst condition, and an over current condition in a power supply of the system.

10. The apparatus of claim 6, wherein the burst module is to detect the burst load condition based on at least one of a burst amplitude threshold and a burst duration threshold.

11. The apparatus of claim 6, wherein the high pass filter is at least one of a hardware filter and a programmable filter.

12. A non-transitory computer readable storage medium comprising a set of stored instructions which, if executed by a processor, cause a mobile device to:

detect a burst load condition in the mobile device, wherein the burst load condition is to present a negative impact with regard to a peak power envelope specification of a mobile device battery;

apply a high pass filter to an audio signal of the mobile device in response to the burst load condition to obtain a filtered audio signal, wherein the high pass filter is to selectively filter out low frequency content to dynamically manage burst loads associated with a high audio output power;

transmit the filtered audio signal to a speaker of the mobile device via an audio codec;

detect a termination of the burst load condition, detect a hysteresis condition, and remove the high pass filter from the audio signal in response to the hysteresis condition and the termination of the burst load condition.

13. The medium of claim 12, wherein the high pass filter is to remove content from the audio signal that is to be below a cutoff frequency and the filtered audio signal is to have a power level that is to be below a power threshold.

14. The medium of claim 12, wherein the instructions, if executed, further cause the mobile device to receive the audio signal from at least one of a high definition (HD) content source and a music source.

15. The medium of claim 12, wherein the burst load condition is to include at least one of a cellular burst condition, a tactile feedback event, a camera flash event, a processor burst condition, a graphics burst condition, a global positioning system (GPS) burst condition, and an over current condition in a power supply of the system.

16. The medium of claim 12, wherein the burst module is to detect the burst load condition based on at least one of a burst amplitude threshold and a burst duration threshold.

17. The medium of claim 12, wherein the high pass filter is to be at least one of a hardware filter and a programmable filter.

* * * * *